United States Patent [19]

Takeya et al.

[11] Patent Number: 4,875,970
[45] Date of Patent: Oct. 24, 1989

[54] METHOD OF FORMING RECESSED PROFILE ON FERRITE SINGLE CRYSTAL BY CHEMICAL ETCHING

[75] Inventors: Fuminori Takeya, Nagoya; Naoya Fukuda, Aichi; Miki Suzuki, Nagoya, all of Japan

[73] Assignee: NGK Insulators, Ltd., Nagoya, Japan

[21] Appl. No.: 291,648

[22] Filed: Dec. 29, 1988

[30] Foreign Application Priority Data

Mar. 29, 1988 [JP] Japan .................................. 63-75744

[51] Int. Cl.$^4$ ..................... B44C 1/22; C03C 15/00; C03C 25/06
[52] U.S. Cl. .................................. 156/645; 156/647; 156/654; 156/659.1; 156/667; 29/603
[58] Field of Search ............... 156/645, 647, 654, 656, 156/659.1, 667; 252/79.2, 79.4; 29/603; 360/110, 122, 125, 127

[56] References Cited

U.S. PATENT DOCUMENTS 4,751,779  6/1988  Nagatomo et al. .............. 156/667 X

FOREIGN PATENT DOCUMENTS

| 51-114111 | 10/1976 | Japan . |
| 52-36016 | 3/1977 | Japan . |
| 54-12819 | 1/1979 | Japan . |
| 62-83483 | 4/1987 | Japan . |
| 62-234214 | 10/1987 | Japan . |

OTHER PUBLICATIONS

"Narrow Track Magnetic Head Fabricated by Means of Ion Etching Method", Takuji Nakanishi et al., MR771-, May 25, 1987, pp. 1-10.

"Silicon as a Mechanical Material", Kurt E. Petersen, Proceedings of the IEEE, vol. 70, No. 5, May 1982, pp. 420-457.

Primary Examiner—William A. Powell
Attorney, Agent, or Firm—Arnold, White & Durkee

[57] ABSTRACT

A method of forming, on a surface of a Mn-Zn ferrite single crystal, a recessed portion which has a predetermined cross sectional profile and at least one straight ridge each of which defines a boundary in the profile. An etching mask is formed on the surface of the ferrite single crystal, so as to provide the recessed portion by etching such that each straight edge of the profile lies in a (100) or (110) plane of the ferrite single crystal which is perpendicular to the surface on which the etching mask is formed. The ferrite single crystal with the etching mask in exposed to an aqueous solution which substantially consists of water and the balance consisting principally of phosphoric acid, whereby the surface of the ferrite single crystal is chemically etched, so as to produce the recessed portion such that an inclined surface is formed so as to extend parallel to the straight ridge, and such that the straight ridge defines an edge of the inclined surface.

15 Claims, 8 Drawing Sheets

METHOD OF FORMING RECESSED PROFILE ON FERRITE SINGLE CRYSTAL BY CHEMICAL ETCHING

BACKGROUND OF THE INVENTION

1. Field of the Invention

The present invention relates in general to a method of forming a desired recessed portion on a surface of a ferrite single crystal, and more particularly to such a method adapted to chemically etch a surface of the ferrite single crystal, so as to produce a magnetic head core having an inclined surface or surfaces, such as a head core for a rigid magnetic disk drive (RDD), or a composite type magnetic head core wherein only a portion adjacent to the magnetic gap of the head core is formed of a magnetic metal.

2. Discussion of the Prior Art

A Mn-Zn ferrite single crystal has been used as a material for magnetic head cores. For the ferrite single crystal to serve its intended purpose, the crystal should be precisely shaped as required.

For instance, a monolithic type head core 1 as illustrated in FIG. 1 is known as a typical magnetic head core for a rigid magnetic disk drive (RDD). In this head core 1, a sliding surface for sliding contact with a recording medium includes air-bearing surfaces 3 and a signal recording/reproducing (writing/reading) track 4, which surfaces 3 and track 4 are defined by grooves 2 formed in the ferrite single crystal. For preventing the edges of the air-bearing surfaces 3 and track 4 from being damaged due to contact with the surface of the recording medium, the edges are chamfered as indicated at 5, 6, 7, 8, 9 and 10. These chamfered or inclined surfaces 5-10 define the nominal widths of the air-bearing surfaces 3 and track 4.

Commonly, the grooves 2 and the chamfered or inclined surfaces 5-10 of the magnetic head core 1 are formed by grinding with a diamond wheel, or by other machining operations. The grooving and chamfering by grinding require a total of eight grinding passes or paths for each head core, and are the most time-consuming step of the process for forming the desired profile. Further, it is inevitable that the widths of the air-bearing surfaces 3 and track 4 have an error of about ±10 microns from the nominal values, due to a positioning error of the grinding wheel, and a variation in the thickness or height of the workpiece. Moreover, the surfaces finished by the diamond wheel inevitably suffer from chipping of one micron or more.

Recently, there has been an increasing requirement for improved accuracy of the widths of the air-bearing surfaces 3 and track 4 of the head core, say, to within ±1 micron, keeping pace with an increasing demand for improved recording density per unit area of the recording medium, and improved accuracy of air-bearing surfaces 3 and magnetic characteristics of the RDD head core 1. It is also noted that the chipping or cracking of the air-bearing surfaces 3 and track 4 may lead to chipping or removal of the ferrite material, causing damages of the magnetic head core and the recording medium, during an operation of the head core. Thus, the conventional magnetic head core suffers from the problems of reliability, associated with its floating action and magnetic characteristics.

On the other hand, methods of producing such magnetic head cores by means of photolithography or a chemical etching process have been proposed, as disclosed in laid-open Publication No. 62-234214 of unexamined Japanese Patent Application.

Described more specifically, monolithic RDD magnetic head cores are prepared from a so-called ferrite bar 12 formed of a ferrite single crystal, as illustrated in FIG. 2(a). The ferrite bar 12 has a predetermined magnetic gap 11, and an annular magnetic path formed so as to include the gap. The ferrite bar 12 has a surface 13 which corresponds to a sliding surface of each magnetic head core produced. The sliding surface 13 is mirror-ground, and is subjected to a process for removing residual strain due to the grinding operation. Then, a resist 14 is applied to the processed surface of the ferrite bar 12, so as to form an appropriate etching mask in a pattern corresponding to a recessed portion to be formed on the surface 13. The ferrite bar 12 with the etching mask 14 is subjected to a chemical etching operation, whereby the recessed portion, having a predetermined cross sectional profile partly defined by the air-bearing surfaces 3 and track 4, is formed on the ferrite bar 12.

It is desirable that the recessed portion is formed by etching on the surface of the ferrite single crystal have a high degree of dimensional accuracy. Namely, consistent dimensional accuracy is required of side etching widths W and straightness of straight ridges 15, which define the dimensions of the track 4 and chamfered surfaces 7, 8, for example, as indicated in FIG. 2(b). As indicated above, the dimensional accuracy to within ±1 micron is important to assure improved recording density, magnetic characteristics and reliability of the magnetic head core.

However, the ferrite bar 12 of a Mn-Zn ferrite single crystal for a magnetic head core has a glass filler at the magnetic gap 11. Since the ferrite bar 12 with the glass filler cannot be heated to a temperature higher than a melting point of the glass, a strain on the surface of the ferrite single crystal caused in the grinding process cannot be eliminated. As a result, the side etching widths W tend to be excessive with respect to the nominal values, and the straightness of the straight edges 15 tends to be deteriorated. Thus, the chemical etching process suffers from difficulty in obtaining acceptable dimensional accuracy of the recessed profile formed on the ferrite bar 12.

Also, dry etching methods such as sputtering and ion-beam etching rather than chemical etching, are proposed to process the ferrite bar 12 to form thereon a recessed portion having a desired cross sectional shape. Examples of such dry etching methods are disclosed in laid-open Publication Nos. 51-114111 and 54-12819 of unexamined Japanese Patent Applications. However, the dry etching methods suffer from a low etching rate, and are difficult to practice in an industrially justifiable manner.

SUMMARY OF THE INVENTION

The present invention was developed to solve the problems of the prior art discussed above. It is therefore an object of the present invention to provide a method suitable for forming a desired recessed portion on a surface of a Mn-Zn ferrite single crystal; to economically produce a highly reliable magnetic head core which has an improved degree of dimensional accuracy.

The above object may be attained according to the principle of the present invention, which provides a method of forming a recessed portion on a surface of a Mn-Zn ferrite single crystal, the recessed portion having a predetermined cross sectional profile and at least one straight ridge, each of which defines a boundary in the profile, comprising the steps of: forming an etching mask on the surface of the ferrite single crystal, so as to provide the recessed portion by etching such that the above-indicated at least one straight ridge lies in a (100) or (110) plane of the ferrite single crystal which is perpendicular to the surface of the ferrite single crystal; and exposing the ferrite single crystal with the etching mask to an aqueous solution which substantially consists of water the balance consisting principally of phosphoric acid, thereby chemically etching the surface of the ferrite single crystal, to produce the recessed portion such that an inclined surface is formed so as to extend parallel to the straight ridge and such that the straight ridge defines an edge of the inclined surface.

According to the method of the present invention described above, the desired recessed portion is formed by etching on the surface of the Mn-Zn ferrite single crystal, such that each straight ridge as indicated at 15 in FIG. 2(b), defining a boundary between two adjacent surfaces (4; 7, 8) of the recessed portion, lies in a (100) or (110) plane of the ferrite single crystal which is perpendicular to the surface on which the etching mask is formed. This arrangement permits an improvement in the linearity or straightness of each straight ridge which defines an edge of the inclined surface formed as a result of the chemical etching. Accordingly, the dimensional accuracy of the recessed portion formed on the surface of the ferrite single crystal can be improved. Namely, the dimensional error may be held to within ±1 micron. Therefore, the present invention makes it possible to enjoy the inherent advantages of a chemical etching process over a machining process, i.e., absence of chipping and/or cracking of the ferrite single crystal, and a comparatively large area of processing at one time.

The instant method employing a chemical etching is also advantageous over a dry etching method, in terms of etching rate. For example, an ion-beam etching method using Ar ions is capable of etching at a rate of only 3 microns per hours, while the etching rate of the present method is 20 microns per hour, that is, large than six times that of the ion-beam etching. Consequently, the present method provides a significant increase in the productivity of magnetic head cores using a Mn-Zn single ferrite crystal.

In one form of the present invention, the method further comprises a step of exposing the surface of the Mn-Zn ferrite single crystal to a solution which contains an amine compound, prior to forming the etching mask on the surface of the ferrite single crystal. Preferably, this preliminary treatment of the ferrite crystal surface with the solution containing the amine compound is effected after the surface is cleaned with an organic solvent or pure water. It is also preferable that the preliminary treatment be effected after the Mn-Zn ferrite single crystal is annealed.

In an alternative form of the invention, the method further comprises a step of exposing the surface of the Mn-Zn ferrite single crystal to an aqueous solution containing phosphoric acid, so as to etch the surface to a depth of at least 10 angstroms. This preliminary etching treatment with the aqueous solution of phosphoric acid is also preferably effected after the ferrite crystal surface is cleaned with an organic solvent or pure water.

The above forms of the invention assure increased adhesion between the etching mask and the relevant surface of the Mn-Zn ferrite single crystal, thereby considerably improving the straightness of the straight ridge or ridges of the recessed portion, and accordingly enhancing the dimensional accuracy of the recessed portion.

The Mn-Zn ferrite single crystal to which the present method is applicable may be a single crystal of ferrite, or a monocrystalline portion of a Mn-Zn ferrite material. Where such a monocrystalline portion of a Mn-Zn ferrite is used, an exposed monocrystalline surface of the monocrystalline portion is usually mirror-ground to desired smoothness with a diamond abrasive grain, in a known manner. This preliminary surface treatment of the monocrystalline surface is desired, since the condition of the monocrystalline surface prior to the subsequent chemical etching has an influence on the chemically etched surface, even if the chemical etching process occurs uniformly on the entire surface area. The mirror-grinding operation is preferably conducted by using a diamond abrasive whose grain size is four microns or smaller.

A strain adjacent to the surface of the ferrite single crystal lowers the etching rate of the surface, and degrades the dimensional accuracy of the etched crystal. Therefore, it is recommended to remove such a strain, adjacent to the surface to be chemically etched, before the chemical etching process according to the principle of the invention. This strain removal may be accomplished by preliminary chemical or ion-beam etching, or annealing (heat treatment) in an inert atmosphere such as $N_2$. Preferably, both of the preliminary etching and the annealing are performed to remove the strain. The annealing operation is generally effected at a temperature between 200° C. and 600° C., preferably between 250° C. and 550° C., for at least 10 minutes, preferably at least 30 minutes. Where the Mn-Zn ferrite bar has a glass filler at a magnetic gap or other portions, the upper limit of the annealing temperature is certainly below the melting point of the glass filler.

After the above-indicated surface treatments are completed, and before the etching mask is applied to the monocrystalline surface of the Mn-Zn ferrite according to the invention, the monocrystalline surface of the Mn-Zn ferrite is preferably subjected to a treatment with a solution containing an amine compound, as described above, in order to suitably reduce the side etching widths W of the recessed portion and improve the straightness of the straight ridges. Namely, the treatment with the amine compound solution greatly contributes to improvement in the dimensional and configurational accuracy of the profile of the recessed portion to be formed on the finally chemically etched surface of the ferrite. The amine compounds are preferably selected from alkanol amines such as ethanol amine, diethanol amine and triethanol amine. However, it is possible to use the other amine compounds such as: aliphatic primary amines such as ethyl amine, propyl amine and butyl amine; aliphatic secondary amines such as diethyl amine and dipropyl amine; aliphatic tertiary amines such as triethyl amine; aliphatic unsaturated amines such as allyl amine; alicyclic amines; diamines; triamines; and aromatic amines such as aniline, toluidine and benzyl amine.

The selected amine compound is generally used as an aqueous solution, in which the monocrystalline surface of the Mn-Zn ferrite is immersed, for intended cleaning.

The cleaning conditions such as the concentration of amine compound, temperature and time are determined, depending upon the specific amine compound and the desired cleaning result. Since it is recognized that the concentration of the amine compound in the treating solution has some relationship with the side etching width W, the amine compound concentration is generally held not higher than 50%, preferably within 5-25%, so that treatment with the amine compound solution provides an intended result.

As described above, the preliminary treatment with the amine compound solution may be replaced by preliminary etching with a solution of phosphoric acid, which is also effected prior to the application of the etching mask to the surface of the Mn-Zn ferrite single crystal. By this preliminary etching, the Mn-Zn ferrite surface, on which the etching mask is formed, is etched to a depth of at least 10 angstroms. The instant preliminary treatment also effectively reduces the side etching widths W of the recessed portion to be eventually formed on the relevant surface, considerably improving the straightness of the straight ridges of the recessed portion, and greatly enhancing the dimensional and configurational accuracy of the recessed portion. Usually, the relevant surface of the ferrite is immersed in the phosphoric acid solution. Etching is effected similarly as the subsequently effected etching operation, to form the desired recessed portion, as described below. Phosphoric acid concentration, etching temperature and time are determined, depending upon the desired etching depth.

After the monocrystalline surface of the Mn-Zn ferrite is subjected to a preliminary treatment with a solution containing an amine compound or phosphoric acid, the appropriate etching mask is formed on the treated surface, by a suitable known method such as screen printing, which is selected according to required patterning accuracy and economy. From the standpoint of patterning accuracy and ease of formation of the mask pattern, it is recommended to form the etching mask by exposing a layer of photo resist to a radiation through an appropriate photomask. The photo resist may be either positive or negative. The etching mask may be formed of a suitable metal such as Cr, SiO or $SiO_2$ by vacuum deposition, sputtering or CVD. The material of the etching mask and the method to form the mask are suitably selected, from the standpoint of adequacy, to meet a desired degree of adhesion of the mask to the ferrite surface, as well as in consideration of operational ease and economy.

BRIEF DESCRIPTION OF THE DRAWINGS

The above and optional objects, features and advantages of the present invention will be better understood by reading the following detailed description of the invention, when considered in connection with the accompanying drawings, in which.

DETAILED DESCRIPTION OF THE INVENTION

Figure 1:
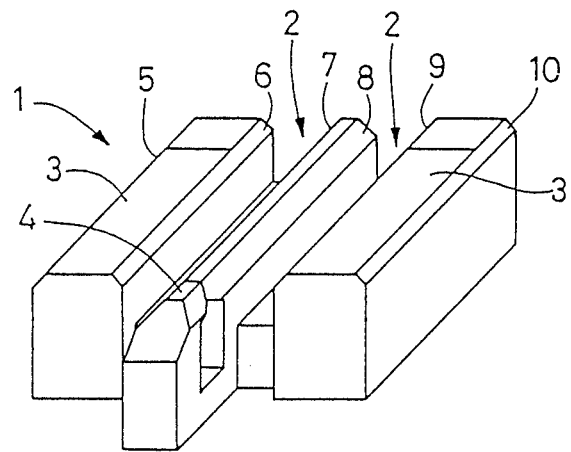
FIG. 1 is a perspective view showing one example of a known magnetic head core for a rigid magnetic disk drive.
Figure 2B:
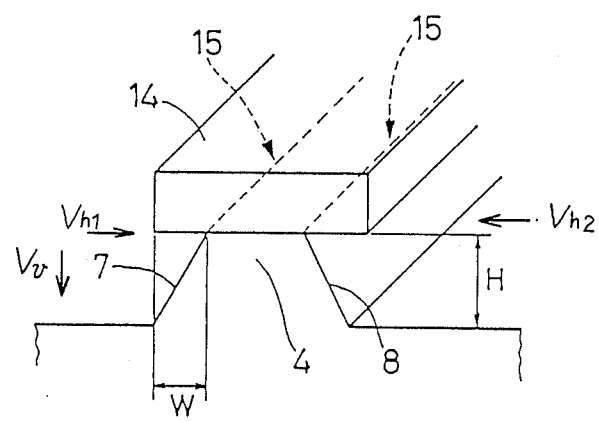
FIG. 2(b) is an illustration indicating a chemical etching step of the method of FIG. 2(a)
Figure 2A:
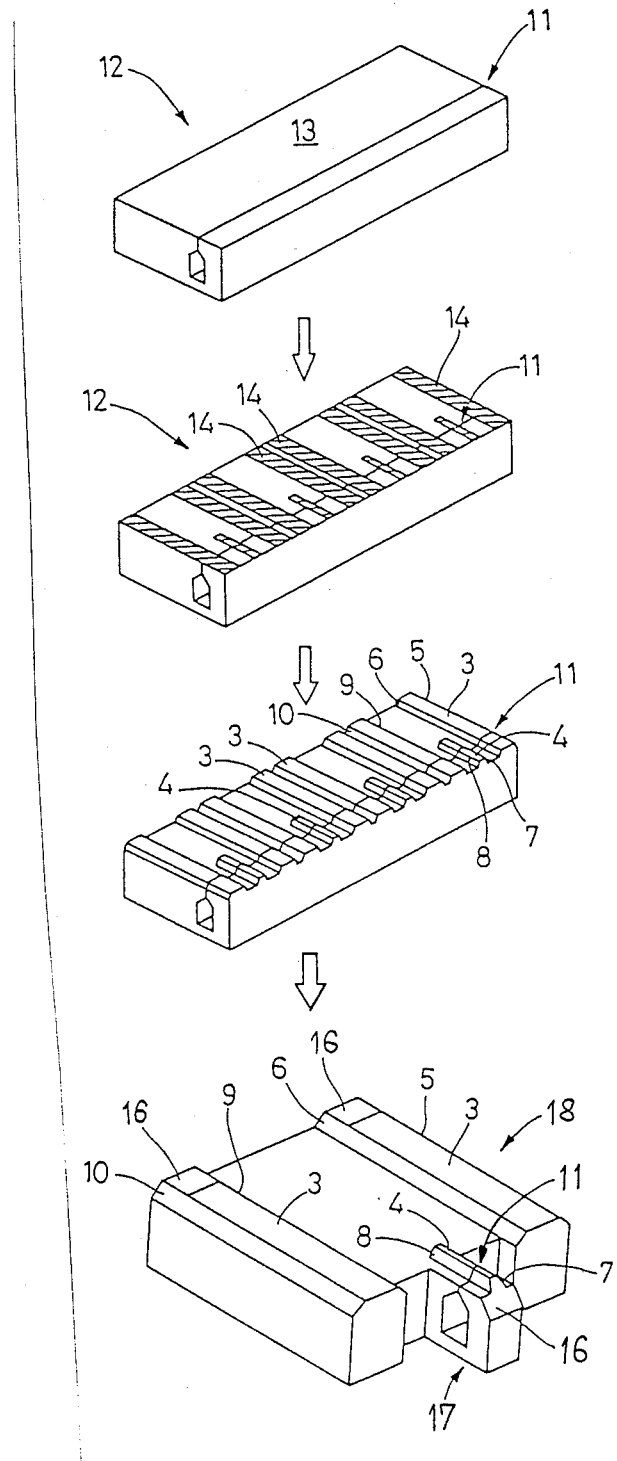
FIG. 2(a) is a perspective view illustrating one embodiment of a method of the present invention adapted to produce a magnetic head core for a rigid magnetic disk drive.

Referring to FIGS. 2(a) and 2(b), there are as indicated by dashed lines in FIG. 2(b) two parallel straight ridges 15 which are formed as a result of chemical etching of ferrite bar 12 of a ferrite single crystal through the etching mask 14. These straight ridges 15 define the width of the track 4. Similar straight ridges 15 are formed so as to define the width of each air-bearing surface 3 as indicated in FIG. 2(a). Therefore, it is desired that the straightness of the ridges 15 be held to within ±1 micron. To meet this goal according to the principle of the present invention, the ferrite bar 12 is chemically etched so as to form the desired recessed portion having a predetermined cross sectional shape, so that straight ridges 15 lie in a (100) or (110) plane or face of the crystal which is perpendicular to the surface on which the etching mask is formed.

Where the recessed portion to be formed by etching according to the present invention includes the air-bearing surfaces 3, each defined by the two straight ridges 15, it is desired that the etched portion has a symmetrical cross sectional shape, for easier subsequent processing and improved flying characteristics of the magnetic head core produced. Generally, the cross sectional shape of the recessed portion formed by etching is influenced by a vertical etching rate Vv, in the direction of depth perpendicular to the surface being etched, and horizontal etching rates Vh1 and Vh2, in the direction of width between the straight ridges 15, as indicated in FIG. 2(b). It will be understood that the recessed or etched portion is given a symmetrical cross sectional shape whereas horizontal etching rates Vh1 and Vh2 are equal to each other.

According to the present invention, one of the planes (100), (110), (211), (311), (332), (611) and (331) of the ferrite single crystal is preferably selected as the surface to be etched, for assuring a symmetrical cross sectional shape and improved magnetic characteristics of the magnetic head core. Further, in order to assure a high level of straightness of the straight ridges (15) to within ±1 micron and the symmetrical cross sectional shape of the etched portion, the etched surface is selected from among the crystal, planes indicted above, and the straight ridges are formed so as to extend in the (100) or (110) plane of the crystal, perpendicular to the etched surface. Therefore, if the (100) plane of the crystal is the surface to be 15 etched, the ridges should extend in direction <100> or <110>. If the (311) plane is selected as the surface to be etched, the ridges should extend in the direction <332>.

The other combinations of the plane of the etched surface of the ferrite single crystal and direction in which the straight ridge or ridges extend, include: (110) and <100>; (110) and <110>; (211) and <111>; (332) and <311>(611) and <331>; and (331) and <611>.

An angle θ of the inclined surfaces 7 and 8, relative to the etched surface of the ferrite single crystal, is determined by a ratio of Vh1 or Vh2 to Vv. Further, the angle may be controlled depending upon the crystal plane selected as the surface to be etched.

The monocrystalline surface of the Mn-Zn ferrite with the appropriate etching mask is then subjected to chemical etching, whereby the desired recessed portion having the predetermined cross sectional shape is formed on the Mn-Zn ferrite.

The chemical etching to form the recessed pattern is effected, preferably by using an aqueous solution consisting of water, the balance being consisting principally of phosphoric acid. This aqueous solution may contain a small amount of other acids such as sulfuric acid in addition to phosphoric acid. The above-indicated balance is considered to consist principally of phosphoric acid if the content of phosphoric acid is 80% or more with respect to the entire amount of the acids contained in the aqueous solution.

Figure 3:
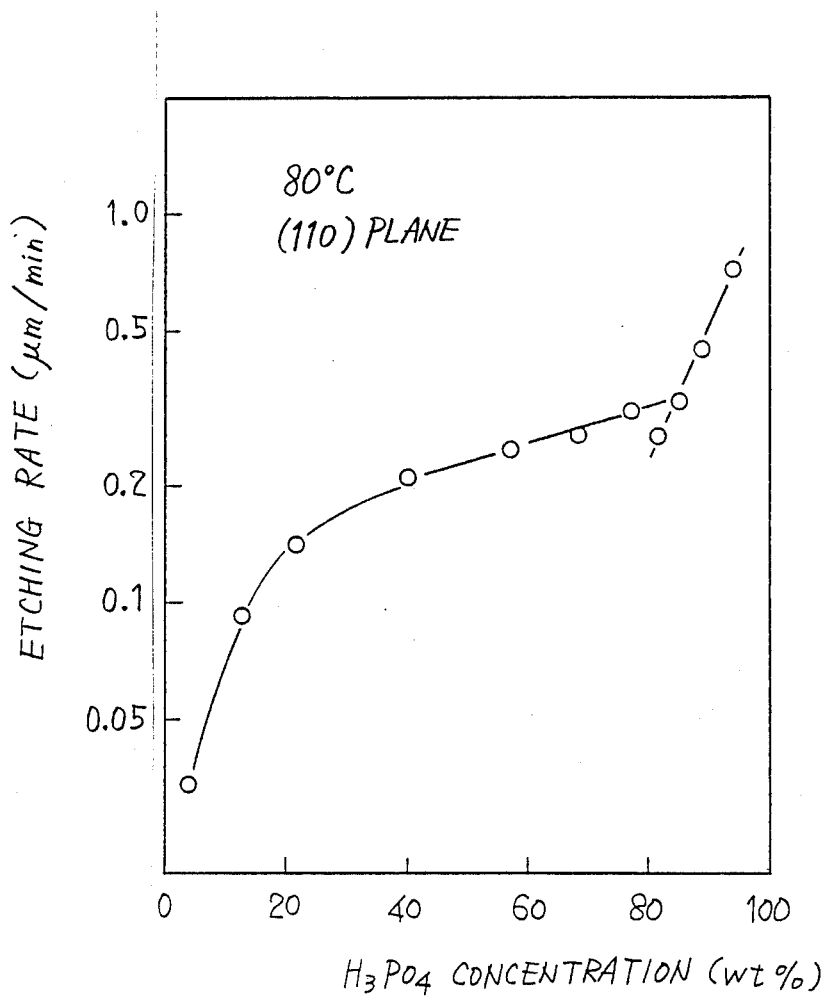
FIG. 3 is a graph showing a relationship between the concentration of a phosphoric acid solution and the etching rate.

The graph of FIG. 3, shows a relationship between the concentration of phosphoric acid in the aqueous solution, and the etching rate. It follows from the graph that the etching rate is extremely high at the phosphoric acid concentration exceeding 80%. It is also noted that the rate of increase in etching rate with the phosphoric acid concentration becomes high when the concentration exceeds the 80% level. Accordingly, with the phosphoric acid concentration exceeding 80%, it is difficult to accurately control the etching amount, and therefore difficult to control the widths of the track 4 and the air-bearing surfaces 3 as shown in FIG. 2(a).

Figure 4:
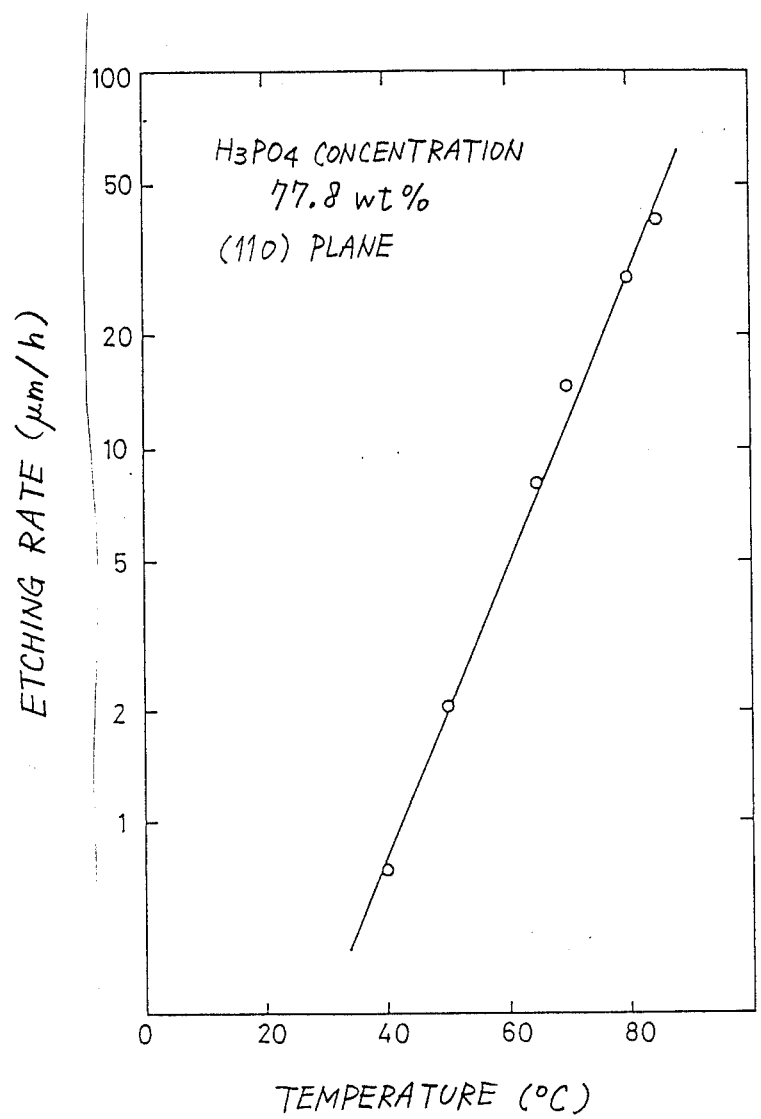
FIG. 4 is a graph showing a relationship between the rate of etching with the phosphoric acid and etching temperature.

The etching rate is also influenced by the etching temperature, as indicated in the graph of FIG. 4. For improved magnetic characteristics of the magnetic head core produced, it is desirable that the top surface of the track 4 be spaced apart at least 10 microns from the bottom of the recess formed by etching. Therefore, the etching depth indicated at H in FIG. 2(b) is desirably 10 microns or more. To this end, the etching operation requires more than about five hours, if the etching temperature is 50° C. or lower, as is understood from the graph of FIG. 4. This etching time is too long to be industrially justified.

Reduction of the etching time is desirable for another reason. That is, where the etching mask is formed of a photo resist, the adhesion between the etching mask and the ferrite surface is decreased due to expansion of the photo resist during a long period of immersion in the etching solution. For improved dimensional accuracy of the etched portion, it is desirable to minimize the etching time.

If the etching temperature exceeds 90° C., the amount of aqueous component of the etching solution containing phosphoric acid changes to an appreciable extent, and the temperature distribution within the etching solution becomes uneven, whereby the etching amount considerably differs at the local areas of the ferrite surface. For this reason, it is recommended that the etching temperature be 90° C. or lower, preferably within a range between 50° C. and 90° C.

Since the etching rate is extremely low with, a phosphoric acid concentration of 5% or lower, as indicated in FIG. 3, the etching solution preferably has a phosphoric acid concentration of 5–80%. However, the etching temperature and the phosphoric acid concentration of the etching solution are not limited to those indicated above, particularly when the required etching amount is comparatively small and when the etching mask has a high degree of adhesion to the ferrite surface. In this case, optimum etching conditions are also determined by the other factors.

While the present invention has been described in detail, it is to be understood that the invention is not limited to the details of the foregoing description, but may be embodied with various changes, modifications and improvements, which may occur to those skilled in the art, without departing from the spirit of the invention.

While the method of the present invention has been described in connection with a magnetic head core for a rigid magnetic disk drive, the principle of the invention is equally applicable to: formation of any recessed patterns having desired cross sectional shapes, a surface of a ferrite single crystal, for example, for forming air-bearing surfaces, tracks, magnetic gaps and other portions of magnetic head cores for a floppy disk drive or a video cassette recorder, or a composite type magnetic head core having a magnetic metal layer adjacent a magnetic gap. The instant method makes it possible to form minute recesses, grooves or holes that cannot be formed by a conventional machining operation.

EXAMPLES

To further clarify the present invention, some examples of the invention will be described together with some comparative examples. It is to be understood that the invention is not limited to the illustrated examples. It is noted that the percentage values that will appear in the following examples are on the basis of weight, unless otherwise specified.

EXAMPLE 1

Ferrite bars each consisting of a Mn-Zn ferrite single crystal were prepared. The (110) surface of each ferrite single crystal bar was mirror-ground in an ordinary manner by a diamond abrasive having a grain size of ¼ micron. The Mn-Zn ferrite bars were subjected to a preliminary treatment using aqueous solutions having different concentrations of ethanol amine from 0% to 100%. That is, the ferrite bars were immersed for 30 minutes, in the respective different solutions kept at 25° C. An etching resist mask was formed by a photolithographic method, on the mirror-ground surface of each of the thus treated ferrite bars, under the conditions indicated in Table 1. Then, the masked ferrite bars were chemically etched in an aqueous solution containing 77.8% of phosphoric acid ($H_3PO_4$) kept at 80° C. Thus, a recessed portion corresponding to the etching mask pattern was formed on the mirror-ground surface of each Mn-Zn ferrite bar, with a vertical etching amount of 20 microns.

TABLE 1

| Resist | OFPR800* |
|---|---|
| Resist thickness | 1.5 micron |

TABLE 1-continued

| | |
|---|---|
| Pre-baking | 85° C. × 30 min. |
| Exposure | 200 mJ/cm$^2$ |
| Development | 23° C. × 60 sec. |
| Post-baking | 140° C. × 30 min. |

*Available from TOKYO OHKA K.K.

Figure 5:
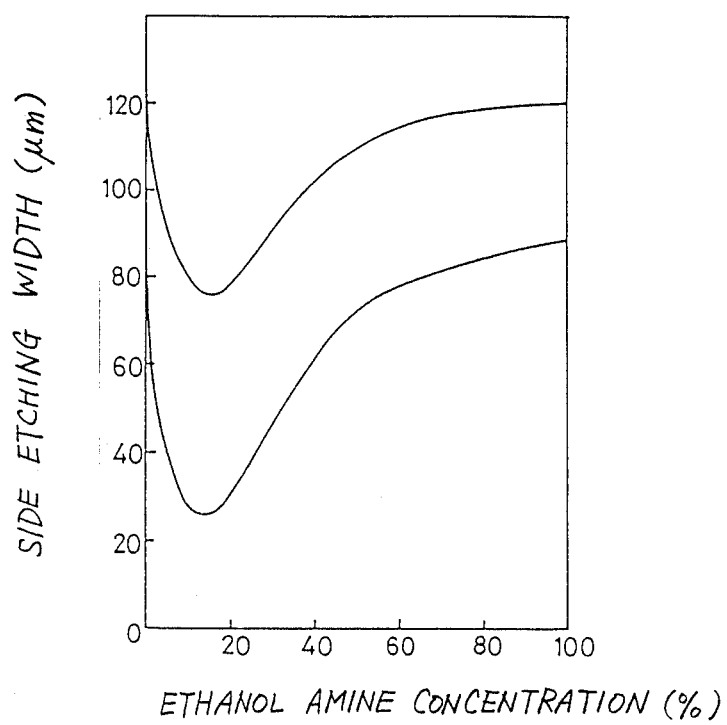
FIG. 5 is a graph showing a relationship between the side etching width and concentration of ethanol amine solution used in Example 1.

The horizontal etching amount or side etching width of the recessed portion formed on each Mn-Zn ferrite bar was measured, as indicated in the graph of FIG. 5, in relation to the concentration of ethanol amine of the corresponding preliminary treatment solution. The upper and lower curves in the graph show the maximum and minimum values of the horizontal etching amount.

It follows from the graph of FIG. 5 that the side etching width or horizontal etching amount has dependence upon the ethanol amine concentration of the treating preliminary treatment solution. It is noted that the preliminary treatments with the ethanol amine concentration of 50% or lower, preferably 5-25%, provided desirable results in terms of dimensional accuracy and straightness of the straight ridges of the chemically etched recessed portion on the ferrite bars.

COMPARATIVE EXAMPLE 1

The (110) plane of each of Mn-Zn ferrite single crystal bars was mirror-ground in an ordinary manner with a diamond abrasive having a grain size of ¼ micron. Without the preliminary treatment with the ethanol amine solution as used in Example 1, the etching resist mask was formed on the mirror-ground surface of each ferrite bar, under the same conditions as indicated in Table 1. Then, the masked ferrite bars were chemically etched in an aqueous solution containing 77.8% of phosphoric acid (H$_3$PO$_4$) kept at 80° C. Thus, a recessed portion corresponding to the etching mask pattern was formed on the mirror-ground surface of each Mn-Zn ferrite bar, with a vertical etching amount of 20 microns.

The side etching width and the straightness of the straight ridges of the recessed portion formed on each ferrite bar of Comparative Example 1 were measured and observed. The measurements of the side etching widths ranged from 90 microns to 135 microns, which are not desirable to obtain the intended recessed portion. Further, the straight ridges of the recessed portion showed poor straightness. Thus, the absence of preliminary treatment of the mirror-ground surface of the Mn-Zn ferrite bar resulted in excessively large side etching widths and poor straightness of the straight ridges.

EXAMPLE 2

Ferrite bars each consisting of a Mn-Zn ferrite single crystal were prepared. The (110) surface of each ferrite single crystal bar was mirror-ground in an ordinary manner by a diamond abrasive having a grain size of ¼ micron. The Mn-Zn ferrite bars were subjected to a preliminary treatment using an aqueous solution containing 20% of ethanol amine kept at 25° C. or 80° C. The ferrite bars were immersed in the solutions, for different time periods ranging 25 minutes to 100 minutes. Then, an etching resist mask was formed by photolithography on the mirror-ground surface of each of the thus treated ferrite bars, under the conditions indicated in Table 1. Then, the masked ferrite bars were chemically etched in an aqueous solution containing 77.8% of phosphoric acid (H$_3$PO$_4$) kept at 80° C. Thus, a recessed portion corresponding to the etching mask pattern was formed on the mirror-ground surface of each Mn-Zn ferrite bar, with a vertical etching amount of 20 microns.

Figure 6:
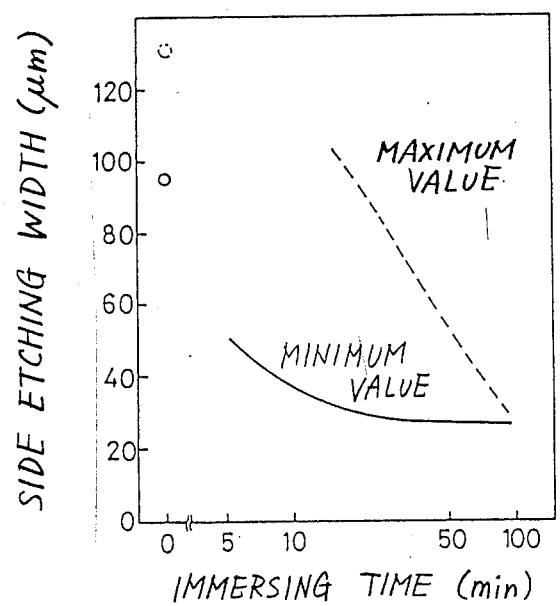
FIGS. 6 and 7 are graphs showing relationships between the side etching width and the cleaning time, obtained in Example 2, where the temperature of the ethanol amine solution was 25° C. and 80° C.
Figure 7:
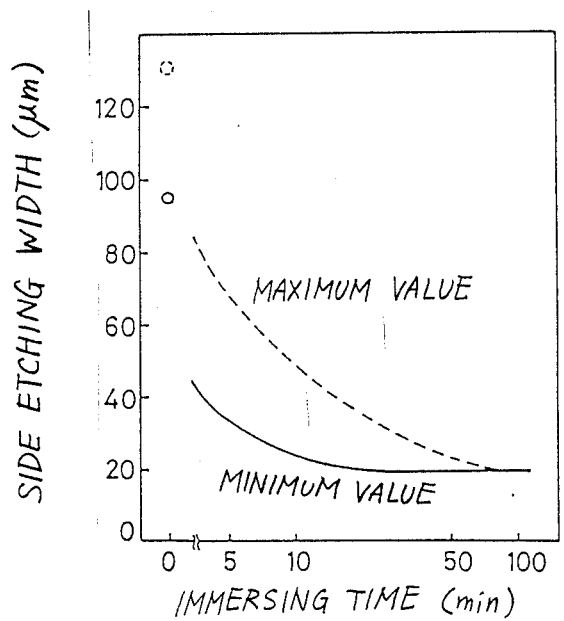

The graphs of FIGS. 6 and 7 show relationships between the side etching width of the recessed portion formed on the ferrite bars and the time of immersion of the bars in the ethanol amine solution. The ferrite bars whose side etching width is shown in FIG. 6 were immersed in the ethanol amine solution kept at 25° C., while the ferrite bars whose side etching width is shown in FIG. 7 were immersed in the ethanol amine solution kept at 80° C. In these graphs, the maximum value of the side etching width is indicated by a dashed curves, while the minimum value is indicated in solid lines. The dashed lines mean comparatively poor straightness of the straight ridges of the recessed portions formed on the ferrite bars.

It follows from the graphs of FIGS. 6 and 7 that the side etching width of the recessed portions formed on the Mn-Zn ferrite single crystal bars decreases with an increase in the immersing time of the bars in the ethanol amine solution. The side etching width was 21 microns where the ferrite bar was immersed for 100 minutes in the ethanol amine solution kept at 80° C. Consequently, this preliminary treatment condition was found to be most preferable to assure a high degree of straightness of the straight ridges of the recessed portions formed by chemical etching.

Table 2 shows the different preliminary treatment conditions, and the corresponding straightness and side etching width of the recessed portions formed on the ferrite bars.

TABLE 2

| Preliminary Treatment | | | | |
|---|---|---|---|---|
| Ethanol Amine Concentration | Temp. (°C.) | Time (min.) | Straightness | Side Etching Wdth (micron) |
| 20% | 25 | 30 | Good | 27–76 |
| 20% | 25 | 100 | Fair | 26 |
| 20% | 80 | 30 | Good | 20–40 |
| 20% | 80 | 100 | Excellent | 21 |

COMPARATIVE EXAMPLE 2

The (110) surface of a Mn-Zn ferrite single crystal bar was mirror-ground in an ordinary manner with diamond abrasive having a grain size of ¼ micron. The ferrite bar was then annealed at 500° C. for 2 hours in an atmosphere of N$_2$. An etching resist mask was formed on the annealed surface of the ferrite bar, under the photolithographic condition indicated in Table 1. Then, the masked ferrite bar was chemically etched in an aqueous solution containing 77.8% of phosphoric acid (H$_3$PO$_4$) kept at 80° C. Thus, a recessed portion corresponding to the etching mask pattern was formed on the mirror-ground surface of each Mn-Zn ferrite bar, with a vertical etching amount of 20 microns. Although the straightness of the straight ridges of the recessed portion was found to be excellent, the side etching width was as large as 105 microns. This indicates that mere preliminary annealing of the mirror-ground surface of the ferrite bar at 500° C. for two hours is not effective enough to assure sufficient reduction in the side etching width of the recessed portion formed on the surface of the ferrite single crystal.

EXAMPLE 3

The (110) surface of a Mn-Zn ferrite single crystal bar was mirror-ground in an ordinary manner with a diamond abrasive having a grain size of ¼ micron. The ferrite bar was then annealed at 500° C. for 2 hours in an atmosphere of $N_2$, and was subjected to a preliminary surface treatment for 30 minutes in an aqueous solution containing 1.5% of ethanol amine kept at 25° C. An etching resist mask was then formed on the annealed surface of the ferrite bar, under the photolithographic condition indicated in Table 1. Then, the masked ferrite bar was chemically etched in an aqueous solution containing 77.8% of phosphoric acid ($H_3PO_4$) kept at 80° C. Thus, a recessed portion corresponding to the etching mask pattern was formed on the mirror-ground surface of each Mn-Zn ferrite bar, with a vertical etching amount of 20 microns.

The side etching width and the straightness of the ridges of the recessed portion, thus formed by chemical etching on the Mn-Zn ferrite surface, were measured and observed. Straightness was found to be excellent, and the side etching width was as small as 18 microns. Thus, the instant example indicates that annealing the Mn-Zn ferrite surface prior to immersion in ethanol amine solution permits a sufficiently small side etching width and excellent ridge straightness of the recessed portion, even where the concentration of ethanol amine in the treatment solution is relatively low and the time of immersion in the solution is relatively short.

EXAMPLE 4

The (110) surface of each of prepared Mn-Zn ferrite single crystal bars was mirror-ground in an ordinary manner with a diamond abrasive having a grain size of ¼ micron. The ferrite bars were then immersed for different periods of time in an aqueous solution containing 77.8% of phosphoric acid kept at 50° C., to etch their mirror-ground surfaces to different preliminary etching depths. The preliminary etching time per 150 angstroms of preliminary etching depth was 30 seconds.

Etching resist masks were formed under the photolithographic condition of Table 1, on the mirror-ground surfaces of the ferrite bars which were given the different preliminary etching depths. The masked surfaces were then chemically etched in an aqueous solution containing 77.8% of phosphoric acid kept at 80° C., whereby the appropriate recessed portions were formed on the mirror-ground surfaces of the ferrite bars, with a vertical etching amount of 20 microns.

Figure 8:
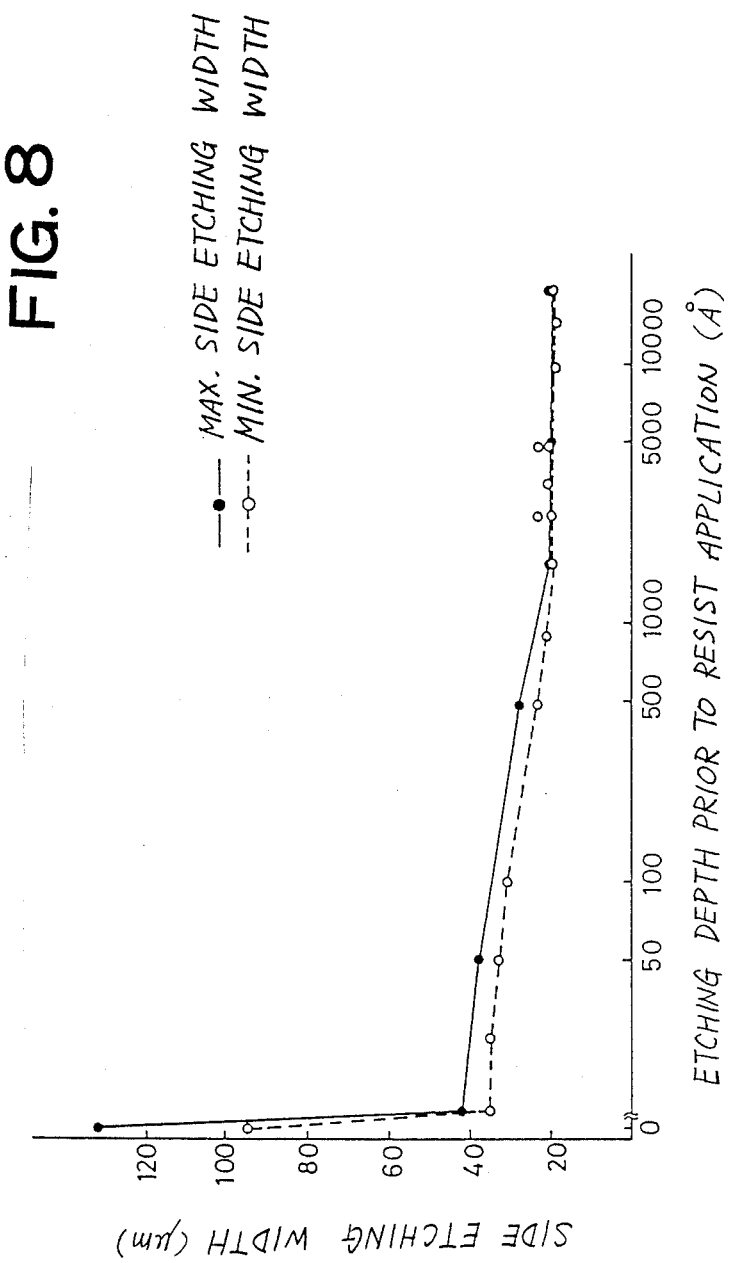
FIG. 8 is a graph showing a relationship between the preliminary etching depth of a ferrite bar prior to application of a masking resist to the ferrite surface, and the side etching width, obtained in Example 4.

The graph of FIG. 8 shows the measured side etching widths of the recessed portions of the Mn-Zn ferrite single crystal bars, in relation to the preliminary etching depth obtained in the preliminary etching step.

As indicated in FIG. 8, the minimum side etching width was reduced from 95 microns to 35 microns by subjecting the mirror-ground surface of the ferrite bar to a preliminary etching by 16 angstroms. Further, the difference between the maximum and minimum side etching widths (variation of the side etching width) was reduced from 37 microns to 7 microns. Thus, it was found that the preliminary etching step provided a considerable improvement in the dimensional and configurational accuracy of the formed recessed portions of the ferrite bars.

It follows from the graph of FIG. 8 and Table 3 below that the depth of preliminary etching prior to the formation of the etching mask is preferably at least 1000 angstroms, for further improvement in dimensional and configuration accuracy of the formed recessed portion of the ferrite bar. Namely, the side etching width of the ferrite bars was consistently held at about 20 microns, with a minimum variation from one ferrite bar to another.

TABLE 3

| Preliminary Etching Depth | Straightness | Side Etching Width (micron) | Total Evaluation |
| --- | --- | --- | --- |
| 13 angstroms | Fair | 35–40 | Good |
| 480 angstroms | Fair | 22–24 | Fair |
| 1700 angstroms | Excellent | 20 | Excellent |

COMPARATIVE EXAMPLE 3

The (110) plane of each of Mn-Zn ferrite single crystal bars was mirror-ground in an ordinary manner with a diamond abrasive having a grain size of ¼ micron. Without preliminary treatment with the phosphoric acid aqueous solution as used in Example 4, the etching resist mask was formed on the mirror-ground surface of each ferrite bar, under the same condition as indicated in Table 1. Then, the masked ferrite bars were chemically etched in an aqueous solution containing 77.8% of phosphoric acid ($H_3PO_4$) kept at 80° C. Thus, a recessed portion corresponding to the etching mask pattern was formed on the mirror-ground surface of each Mn-Zn ferrite bar, with a vertical etching amount of 20 microns.

The side etching width and straightness of the straight ridges of the recessed portion formed on the ferrite bar of Comparative Example 3 were measured and observed. The measurements of the side etching widths ranged from 90 microns to 135 microns, which are not desirable to obtain the intended recessed portion. Further, the straight ridges of the recessed portion showed poor straightness. Thus, the absence of preliminary treatment of the mirror-ground surface of the Mn-Zn ferrite bar with the phosphoric acid aqueous solution resulted in excessively large side etching widths and poor straightness of the straight ridges.

EXAMPLE 5

The (110) surface of each Mn-Zn ferrite single crystal bars was mirror-ground in an ordinary manner with a diamond abrasive having a grain size of ¼ micron. The ferrite bars were then annealed at 500° C. for 2 hours in an atmosphere of $N_2$. The ferrite bars were then immersed for different periods of time in an aqueous solution containing 77.8% of phosphoric acid kept at 50° C., under the same condition as in Example 1, whereby the mirror-ground surfaces of the ferrite bars were etched to different preliminary etching depths.

Etching resist masks were formed under the photolithographic condition of Table 1, on the mirror-ground surfaces of the ferrite bars which were given the different preliminary etching depths. The masked surfaces were then chemically etched in an aqueous solution containing 77.8% of phosphoric acid kept at 80° C., whereby the appropriate recessed portions were formed on the mirror-ground surfaces of the ferrite bars, with a vertical etching amount of 20 microns.

Figure 9:
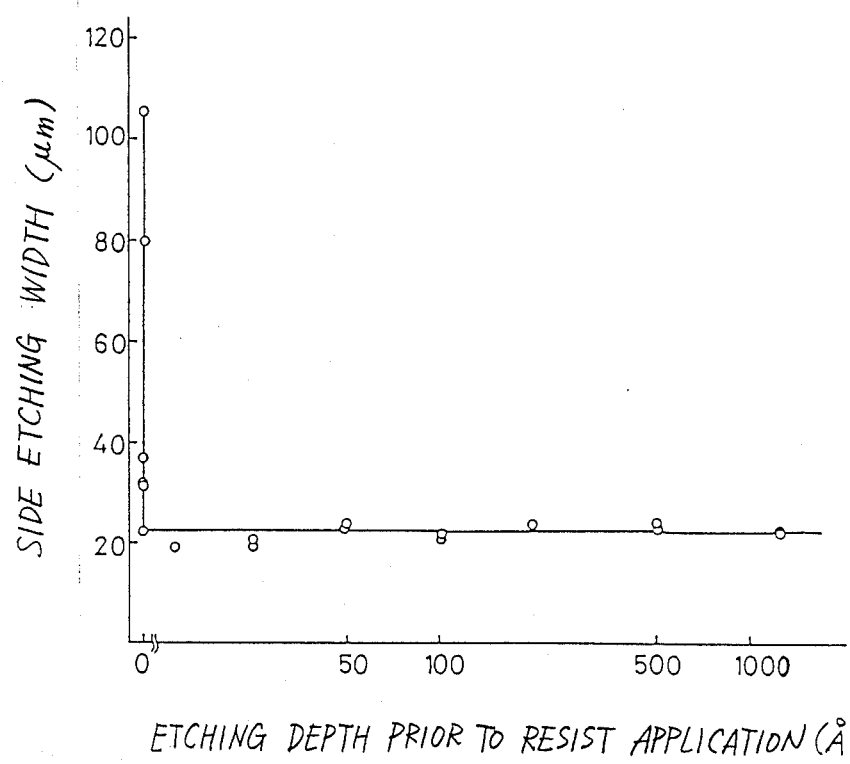
FIG. 9 is a graph showing a relationship between the preliminary etching width and the side etching depth, obtained in Example 5.

The graph of FIG. 9 shows the measured side etching widths of the recessed portions of the Mn-Zn ferrite single crystal bars of Example 5, in relation to the preliminary etching depth obtained in the preliminary etching step.

A comparison of the result of FIG. 9 with the result of FIG. 8 of Example 4 reveals that annealing the mirror-ground surfaces of the ferrite bars prior to formation of the etching resist masks permits the side etching width to be consistently held at 20 microns, even with a preliminary etching depth of 13 angstroms. It was found that only the annealing treatment without preliminary etching resulted in a considerably large variation of 22–105 microns in the side etching width, from one ferrite bar to another. That is, the absence of preliminary etching causes insufficient consistency in the side etching width of the products obtained from the same ferrite blank.

EXAMPLE 6

A selected surface of each of the Mn-Zn ferrite single crystal bars having different crystal orientations was mirror-ground in an ordinary manner with diamond abrasive having a grain size of ¼ micron. The ferrite bars were then annealed at 500° C. for 2 hours in an atmosphere of $N_2$. The ferrite bars were then immersed in an aqueous solution containing 77.8% of phosphoric acid kept at 50° C., under the same condition as in Example 1, whereby the mirror-ground surfaces of the ferrite bars were etched to a preliminary etching depth of 100 angstroms.

Etching resist masks were formed under the photolithographic condition of Table 1, on the preliminarily etched mirror-ground surfaces of the ferrite bars. The masked surfaces were then chemically etched in an aqueous solution containing 77.8% of phosphoric acid kept at 80° C., whereby the appropriate recessed portions were formed on the mirror-ground surfaces of the ferrite bars, with a vertical etching amount of 10 microns.

Table 4 shows the dimensional accuracy and cross sectional shape of the recessed portions formed on the ferrite single crystal bars which have different crystal orientations.

It will be understood from Table 4 that the dimensional accuracy of the recessed portions is comparatively low and the cross sectional shape of the recessed portions is asymmetrical, whereas the straight ridges, each defining a boundary between two adjacent surfaces, do not lie in a (100) or (110) plane of the ferrite single crystal, which is perpendicular to the etched surface and on which the recessed portion is formed by chemical etching through the etching mask. More specifically, the following combinations of the etched surface and the direction of the ridges are relatively poor in dimensional accuracy and symmetry of the recessed portion formed on the ferrite single crystal, and the recessed portion cannot suitably be used as a track of a magnetic head core: (211) and <110>; (311) and <110>; and (332) and <110>.

TABLE 4

| Etched Surface | Direction of Ridges | Dimensional Accuracy (μm) | Cross Sectional Shape |
|---|---|---|---|
| (100) | <100> | ±0.8 | 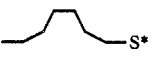 S* |
| (100) | <110> | ±1.0 | 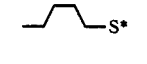 S* |
| (110) | <100> | ±0.5 |  S* |
| (110) | <110> | ±1.0 | 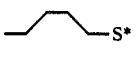 S* |
| (211) | <111> | ±0.5 | 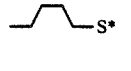 S* |
| (311) | <332> | ±0.7 |  S* |
| (332) | <311> | ±1.0 |  S* |
| (611) | <331> | ±0.8 | 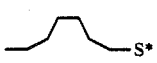 S* |
| (331) | <611> | ±1.0 | 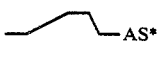 S* |
| (211) | <110> | ±1.6 | 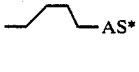 AS* |
| (311) | <110> | ±3.0 | 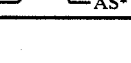 AS* |
| (332) | <110> | ±2.0 |  AS* |

S: Symmetrical
AS: Asymmetrical

EXAMPLE 7

A ferrite bar 12 as shown in FIG. 2(a) for monolithic RDD magnetic head cores was prepared from two ferrite single crystals which were bonded together so as to form an annular magnetic path, such that the surfaces defining the magnetic gap 11 were defined by the (100) planes of the two crystals while the sliding surface 13 and the side surfaces of the bar 12 were defined by the (110) planes of the crystals. The sliding surface 13 was mirror-ground in an ordinary manner with a diamond abrasive having a grain size of ¼ micron, and then annealed for two hours at 500° C. in an atmosphere of $N_2$. The annealed surface 13 was subjected to a preliminary etching in an aqueous solution containing 77.8% of phosphoric acid kept at 50° C., for etching the surface to a preliminary etching depth of 100 angstroms.

Subsequently, the etching resist mask 14 was formed on the thus treated surface 13, by the photolithographic method whose condition is indicated in Table 1. The masked surface was chemically etched in an aqueous solution containing 77.8% of phosphoric acid kept at 80° C. Thus, a plurality of recessed portion each including two air-bearing surfaces 3 and one track 4, which are defined by 70°-inclined chamfered surfaces 5–10, with the groove having a depth of 20 microns formed between air-bearing surfaces 3.

In the instant example, the side etching width was also 20 microns. Therefore, the width of the portions of the etching mask 14 which correspond to the air-bearing surfaces 3 and track 4 should be larger by 40 microns than the nominal width of the air-bearing surfaces and track 3, 4.

The chamfered surfaces 16 were then formed at the end portions of the air-bearing surfaces 3 and tracks 4 of the recessed portions, as shown in FIG. 2(a). Then, the ferrite bar 12 was subjected to a cutting operation so that the yoke portion 17, including the track 4, was left for each recessed portion which corresponds to one monolithic RDD magnetic head core. Finally, the ferrite bar 12 was cut into individual magnetic head cores.

According to the instant method of forming the magnetic head cores in a chemical etching process, the air-bearing surfaces 3 and the track 4, and the chamfered surfaces 5–10 adjacent to the surfaces 3 and track 4 were concurrently formed, such that the widths of the surfaces 3 and track 4 were determined by the parallel edges (straight ridges 15) of the chamfered surfaces 5–10. Accordingly, the number of process steps of the present method necessary in the formation of magnetic head cores is considerably reduced, as compared with the conventional method by grinding with a diamond wheel. Further, the present method assures extremely high dimensional accuracy of the air-bearing surfaces 3 and track 4 to within ±1 micron, which is determined by the dimensional accuracy of the photolithographically formed etching mask and by the side etching width accuracy in the chemical etching step. This dimensional accuracy of the air-bearing surfaces 3 and track 4 is a significant improvement over the highest possible dimensional accuracy of about ±10 microns which is available in the conventional method, wherein the chamfered surfaces 3 defining the widths of the air-bearing surfaces and track 4 are formed by grinding.

What is claimed is:

1. A method of forming a recessed portion on a surface of a Mn-Zn ferrite single crystal, said recessed portion having a predetermined cross sectional profile and at least one straight ridge each of which defines a boundary in said profile, comprising the steps of:

forming an etching mask on the surface of said ferrite single crystal, so as to provide said recessed portion by etching such that said at least one straight ridge lies in a (100) or (110) plane of said ferrite single crystal which is perpendicular to said surface; and exposing said ferrite single crystal with said etching mask to an aqueous solution which substantially consists of water, the balance consisting principally of phosphoric acid, thereby chemically etching said surface of the ferrite single crystal, to produce said recessed portion such that an inclined surface is formed so as to extend parallel to said straight ridge and such that said straight ridge defines an edge of said inclined surface.

2. A method according to claim 1, wherein a combination of the plane of said surface of said ferrite single crystal and the direction of extension of said at least one straight ridge is selected from the group which consists of: (100) and <100>; (100) and <110>; (110) and <110>; (211) and <111>; (311) and <332>; (332) and <311>; (611) and <331>; and (331) and <611>.

3. A method according to claim 1, further comprising a step of exposing said surface of the Mn-Zn ferrite single crystal to a solution containing an amine compound, prior to forming said etching mask on said surface.

4. A method according to claim 3, further comprising a step of annealing said Mn-Zn ferrite single crystal.

5. A method according to claim 4, wherein said step of annealing said Mn-Zn ferrite single crystal is effected at a temperature of 200°–600° C. for a period of at least 10 minutes.

6. A method according to claim 3, wherein said amine compound is selected from the group consisting of: alkanol amines; aliphatic primary amines; aliphatic secondary amines; aliphatic tertiary amines; aliphatic unsaturated amines; alicyclic amines; diamines; triamines; and aromatic amines.

7. A method according to claim 6, wherein said amine compound is selected from the alkanol amines.

8. A method according to claim 3, wherein a concentration of said amine compound in said solution is held within a range not exceeding 50%.

9. A method according to claim 1, further comprising a step of exposing said surface of the Mn-Zn ferrite single crystal to an aqueous solution containing phosphoric acid, so as to etch said surface to a depth of at least 10 angstroms, prior to forming said etching mask on said surface.

10. A method according to claim 1, further comprising a step of removing a strain from said Mn-Zn ferrite single crystal, prior to forming said etching mask on said surface.

11. A method according to claim 1, further comprising a step of mirror-grinding said surface of said Mn-Zn ferrite single crystal, prior to forming said etching mask on said surface.

12. A method according to claim 11, wherein said step of mirror-grinding said surface of said Mn-Zn ferrite single crystal is effected with a diamond abrasive having a grain size of ¼ micron.

13. A method according to claim 1, wherein said surface of the Mn-Zn ferrite single crystal is formed is a (110) plane of said crystal, while said at least one straight ridge extends in a direction <100> of the crystal.

14. A method according to claim 1, wherein said aqueous solution contains 5–80% by weight of phosphoric acid.

15. A method according to claim 14, wherein said aqueous solution is kept at a temperature of 50°–90° C.

* * * * *